United States Patent [19]

Stampfli

[11] Patent Number: 4,999,742

[45] Date of Patent: Mar. 12, 1991

[54] ELECTRONIC MODULE FOR A SMALL PORTABLE OBJECT SUCH AS A CARD OR A KEY INCORPORATING AN INTEGRATED CIRCUIT

[75] Inventor: Jean-Marcel Stampfli, Le Landeron, Switzerland

[73] Assignee: ETA SA Fabriques d'Ebauches, Granges, Switzerland

[21] Appl. No.: 455,011

[22] Filed: Dec. 22, 1989

[30] Foreign Application Priority Data

Dec. 27, 1988 [FR] France ................................ 88 17210

[51] Int. Cl.$^5$ ................................................ H05H 7/02
[52] U.S. Cl. ........................................ 361/400; 336/96; 336/200; 336/202; 361/392
[58] Field of Search .................... 336/65, 96, 199–200, 336/205–208; 361/392, 395, 399, 400, 401, 398; 174/52.2, 52.4

[56] References Cited

FOREIGN PATENT DOCUMENTS

| 2044691 | 2/1971 | France . | |
|---|---|---|---|
| 4425018 | 10/1969 | Japan | 336/96 |
| 0123990 | 6/1986 | Japan | 361/400 |
| 8402688 | 5/1984 | PCT Int'l Appl. . | |
| 8800785 | 1/1988 | PCT Int'l Appl. . | |
| 2149209 | 6/1985 | United Kingdom . | |

OTHER PUBLICATIONS

Conference Record of the 1987 IEEE Industry Application Society Annual Meeting Part II, 18–23 Oct. 1987, "Radio Frequency in the Automatic ID Marketplace", pp. 1231–1243.

Primary Examiner—Gregory D. Thompson
Attorney, Agent, or Firm—Sughrue, Mion, Zinn, Macpeak & Seas

[57] ABSTRACT

The invention concerns an electronic module for a small portable object such as a card or a key incorporating an integrated circuit, and a method of mass producing such modules. The electronic module according to the invention includes a substrate (24) of insulating material, an integrated circuit chip (8) having at least two connector lugs (10) and which is fixed at least indirectly to the substrate, a coil (12) also fixed on the substrate and serving to provide an inductive coupling between the module and an apparatus with which the portable object is designed to cooperate, and electrical connections (18,20) respectively between the chip's connector lugs and the terminals (17) of the coil. In this module, the coil is an annular coil which surrounds a space in which the chip and the electrical connections are fully housed in a hardened, electrically insulating adhesive material (28) filling the space. Such a module may be mass produced at low cost and, when it is then incorporated in a card, the coil effectively protects the chip and the electrical connections against any constraints to which the card is submitted.

9 Claims, 5 Drawing Sheets

Fig. 1
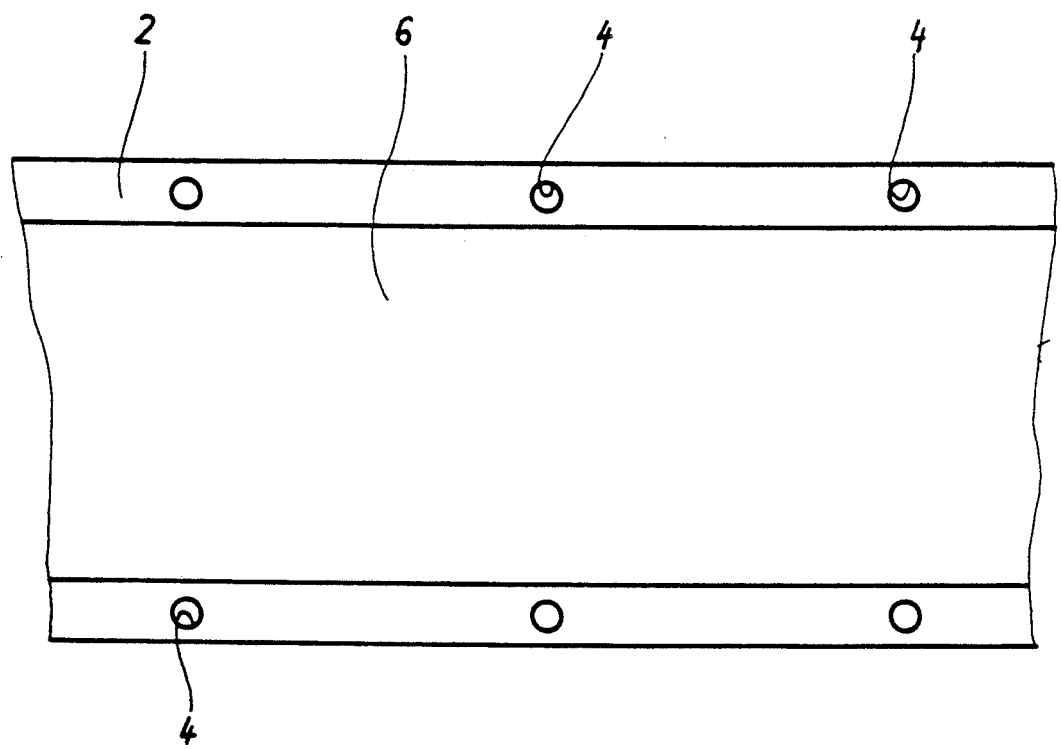
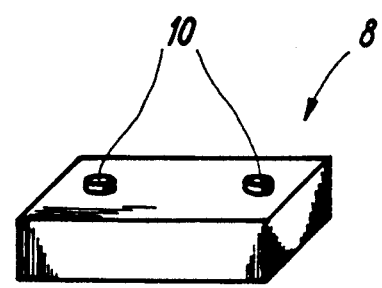
Fig. 2
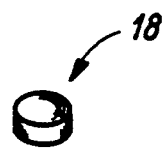
Fig. 4

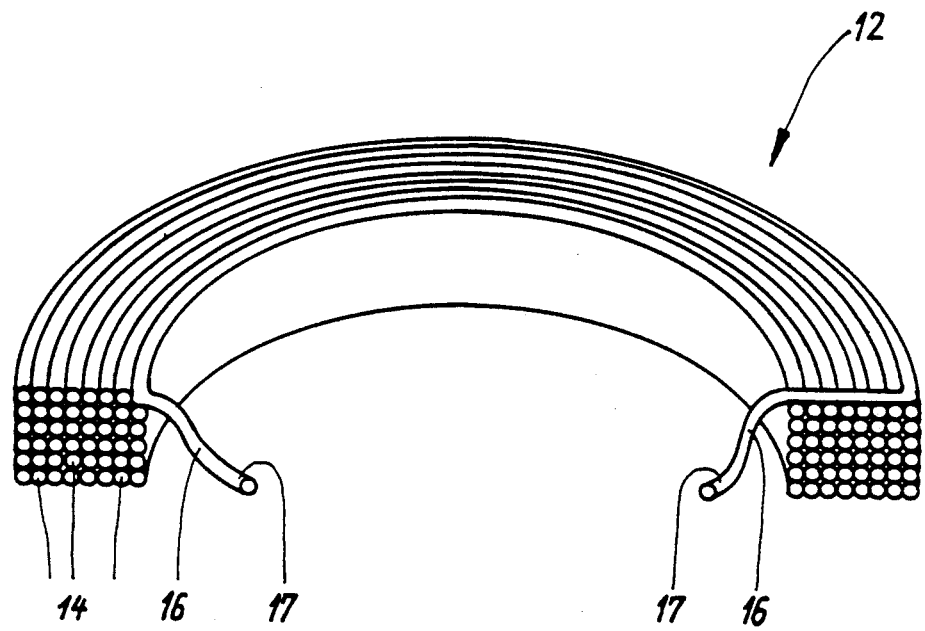
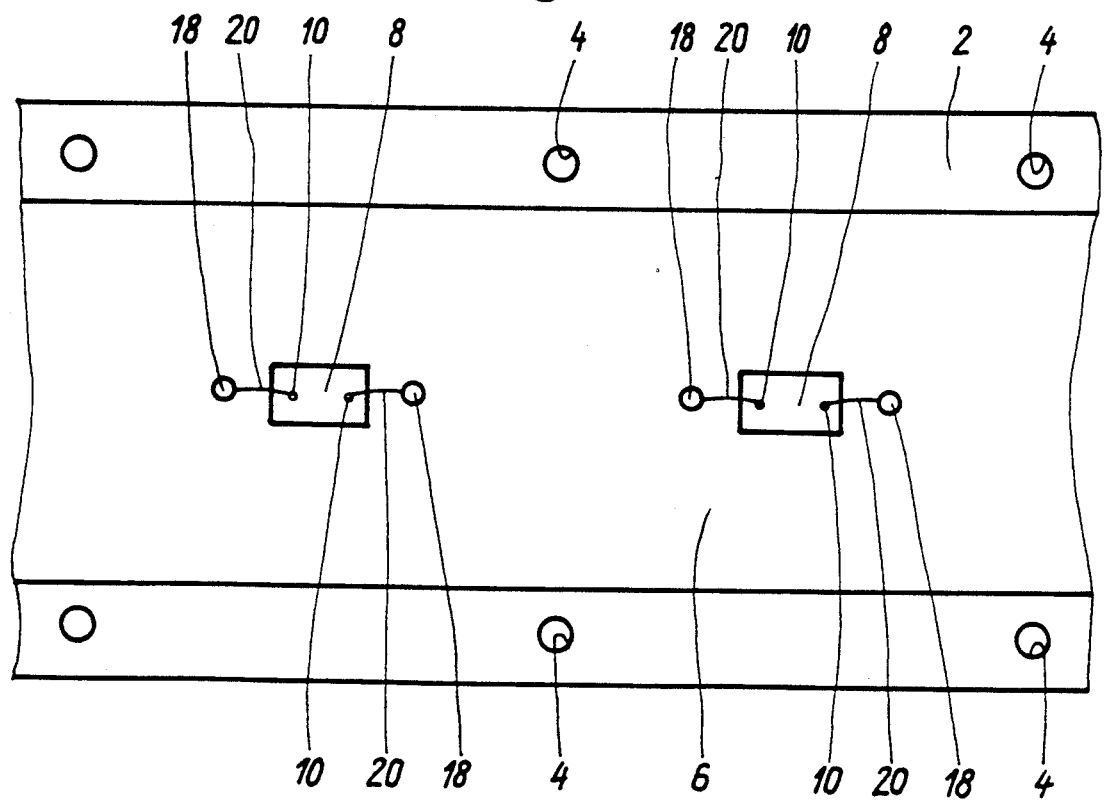

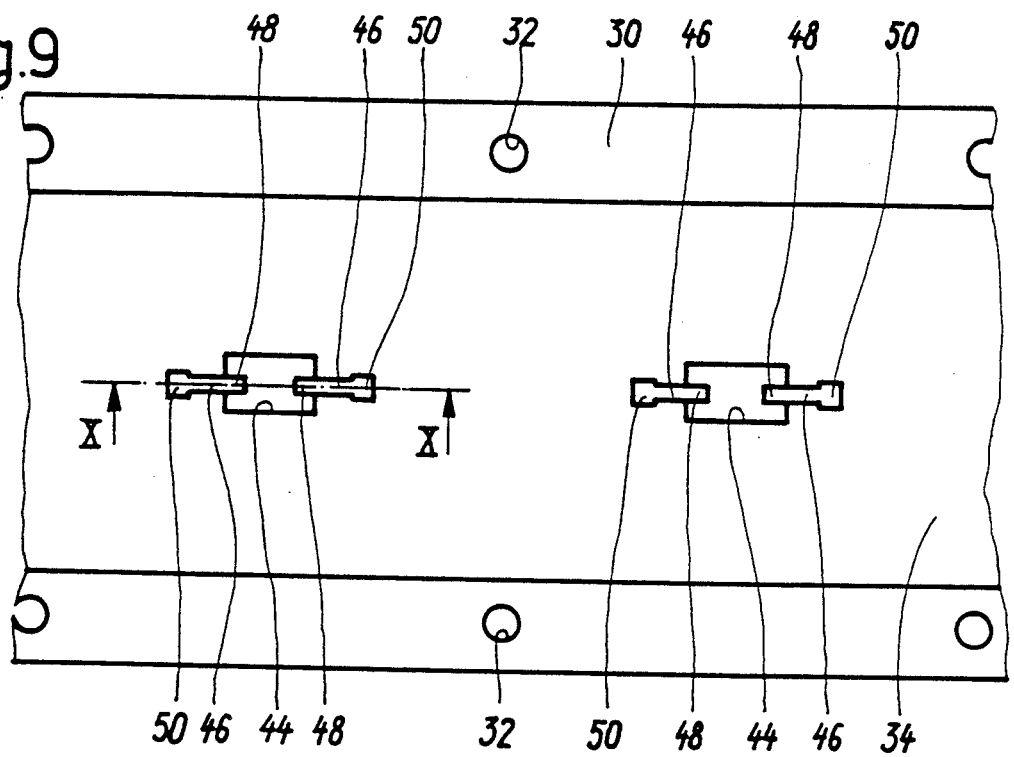
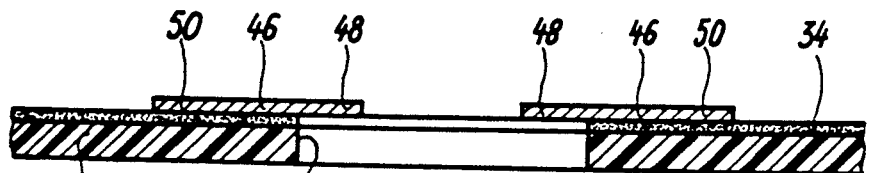
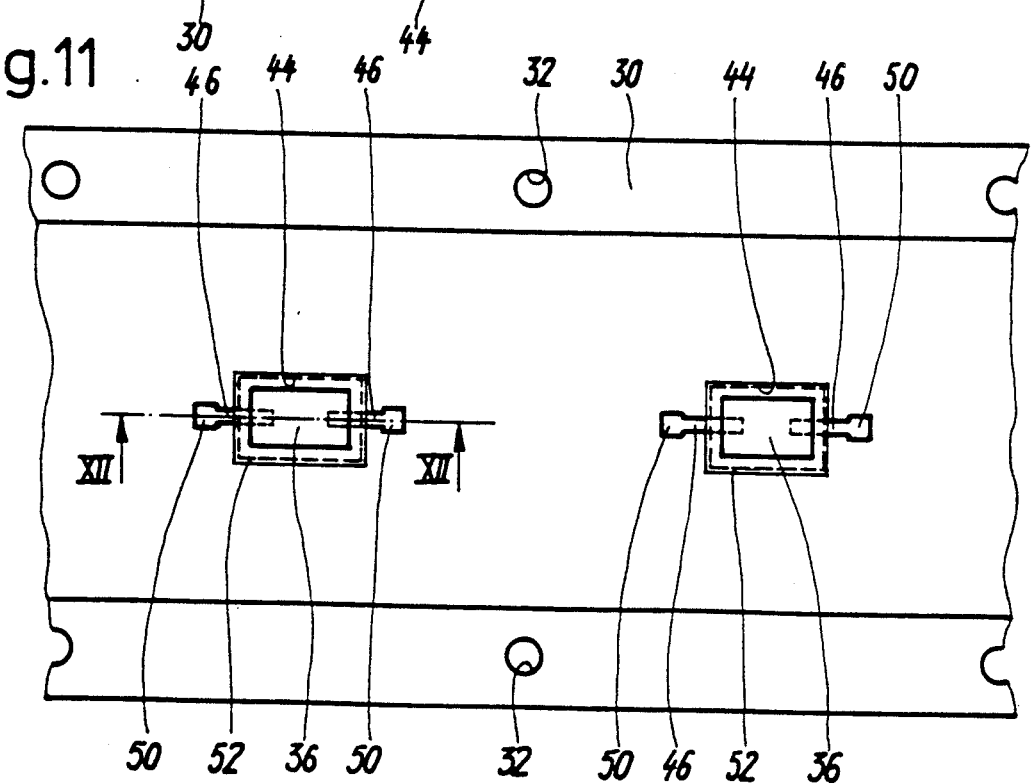

ELECTRONIC MODULE FOR A SMALL PORTABLE OBJECT SUCH AS A CARD OR A KEY INCORPORATING AN INTEGRATED CIRCUIT

BACKGROUND OF THE INVENTION

The present invention relates to an electronic module for the mass production of small portable objects such as integrated circuit cards, for example credit cards, bank cards, payment cards for public telephones, and access cards for entering private or security areas or where payment is required, or keys having integrated circuits for the same purposes.

Known integrated circuit cards usually have a plurality of electric contact areas which can be accessed by the connector parts of apparatus in which the cards are designed to be inserted.

For some applications, such as for example the control of access to private or security areas, a card's integrated circuit may consist only of a memory which is directly connected to the contact areas by electrical conductors and which contains data that can be read, and only read, by an apparatus designed to receive the card.

For other applications, for instance where the card can be used by its holder to make payments or transactions, the circuit additionally comprises a microprocessor installed between the contact areas and the memory and which may be integrated in the same chip as the memory or in a separate chip. In this case, the apparatus with which the card may be used can not only read data in its memory but can also enter new data.

Moreover, in some cases, the various elements forming the card's electronic circuit, with the exception of the contact areas, are embedded in a body of homogeneous or composite insulating material to thereby form a module which is then inserted in a corresponding opening in the body of a card.

Aside from questions related to the integrated circuit itself (for instance what data the memory should contain, which functions should be performed by the microprocessor if one is provided, and how the memory and possibly also the microprocessor should be designed), the manufacture of the aforementioned types of integrated circuit cards involves a number of problems, in particular because of the rather numerous requirements they have to meet.

Firstly, these cards must generally have the same format as a card having a standard magnetic track, namely a length of 85 mm, a width of 54 mm and a thickness of 0.76 mm (ISO norms), or at least have close-to-standard dimensions in order to remain compact and easy to handle.

Bearing in mind: firstly, that a thickness of 760 microns corresponds roughly to only about twice the thickness of the chip of a non-protected integrated circuit; secondly, that the portion of a card's surface that can be allocated to the electronic circuit is often very limited because the major part thereof must be reserved for inscriptions such as the identification of the card-issuing entity, the card holder's identity, a signature, data needed for use and, possibly, a photo; and thirdly, that the conductor areas must be large enough to ensure a good contact with the connector members of an apparatus, it can readily be understood that standardised pre-coated, or pre-encased circuits that are at present available on the market cannot be used because they are too bulky.

To manufacture these cards or the electronic modules associated therewith it therefore becomes necessary to start with bare integrated circuit chips, fabricate the network of interconnections enabling these chips to make external electrical connections and inter-chip connections if there are several chips in the same card, and provide a protection for the assembly which is inherently very fragile especially at the junctions of conductive parts (chip connector lugs, wires, etc.)

This protection needs to be particularly effective when the cards are liable to undergo frequent and possibly large deformations due to the fact that these cards, like conventional cards, must meet quite strict norms or requirements concerning their flexibility, and the needed protection cannot be guaranteed by rigidifying the electronic modules or the areas of the cards where the circuits are situated because the flexibility requirements would no longer be fulfilled.

Furthermore, external agents like light or humidity must be prevented from deteriorating the circuit or perturbing operation.

For electronic keys which also have contact areas but are not as thin as cards and instead need to be rigid, these problems of protecting the chip(s) and the electric connections hardly occur in practice because the chips are embedded in relatively large blocks of hard plastic material which give the keys their shape.

However, there are at least two other problems that have not yet been discussed, concerning both keys and cards.

The first of these problems is that in both cases the contact areas must be designed to resist as well as possible any wear caused by the connector parts of apparatus adapted to receive the keys or cards, and frequently also they should be able to function properly even in a hostile environment such as damp or polluted air. For this reason, the areas are often formed of several superimposed layers of different metals, for example copper, nickel and gold, which obviously has the drawback of increasing the cost price of the card or key.

The second problem is that these contact areas may receive electrostatic discharges which overload the protection systems provided in the integrated circuits. When this happens, these circuits are destroyed and the cards or keys containing them are rendered inoperative.

However, there are known systems in which the transfer of data between a card and a reading or recording apparatus does not take place by electric contact as in those just discussed, but by an inductive coupling between two coils included respectively in the card and in the apparatus for receiving the card.

In these systems, the card's integrated circuit is housed in an opening provided in the card's body and the coil consists of a metal strip formed on this body using conventional printed-circuit techniques.

Thus, in this case, there are no longer any problems associated with contacts However, the problems of protecting the chip(s) and the electric connections between the various elements of the card's electronic circuit remain.

Moreover, cards of this type have at least one drawback: because of the coil their cost price is relatively high—more than the cost of most contact-type cards-—and this price increases proportionally with the surface area on the card body occupied by the coil.

Of course, it is always desirable that integrated circuit cards should be as inexpensive as possible, especially cards of the throw-away type that initially have a set value paid for when the card is purchased, and that are discarded when the value has been used.

SUMMARY OF THE INVENTION

One objective of the invention is to provide cards of the non-contact type, like those just discussed, which are of low cost and wherein the problem of protecting the fragile parts of their electronic circuit is solved in satisfactory manner by providing a complete electronic module designed to be located and fixed within a card body in the same manner as the module of a contact-type card.

Another objective of the invention is that this module may also serve for the manufacture not only of keys that could be a substitute for cards in at least some of their applications, but also for example of tabs and other cards like those used at present for the identification of remote persons or things and which include an inductive antenna connected to an integrated circuit to emit and receive radio frequency electromagnetic radiation.

These objectives are fulfilled due to the fact that the module according to the invention comprises a substrate of electrically insulating material, an integrated circuit chip provided with at least two connector lugs and which is at least indirectly fixed to the substrate, a coil having two terminals and also fixed on the substrate for enabling inductive coupling of the module and an apparatus with which an object in which the module is incorporated can cooperate, and respective electrical connections between the chip's connector lugs and the coil's terminals, and due to the fact that the coil is an annular coil which surrounds a space in which the chip and said electrical connections are fully housed in a hardened, electrically insulating adhesive material filling the space.

Additionally, the invention also concerns a method of mass producing modules of this kind which comprises:
firstly providing a tape of electrically insulating material, a plurality of identical chips and a plurality of identical annular coils;
fixing the chips at least indirectly to the central part of the tape in such a manner that they are regularly spaced apart longitudinally of the tape;
fixing the coils to the tape about the chips;
providing electrical connections between the chips' connector lugs and the coils' terminals;
filling the spaces surrounding the coils with a hardenable, insulating adhesive material; and, after this material has hardened,
cutting the tape around each coil to obtain the modules.

BRIEF DESCRIPTION OF DRAWINGS

Further characteristics and advantages of the invention will be apparent from the following description of two selected examples of carrying out this method and two possible embodiments of modules according to the invention produced by these methods This description is made by way of example with reference to the accompanying drawings in which:

FIG. 1 is a partial plan view of a perforated insulating tape covered with a layer of an adhesive material, used for manufacturing modules according to the first example of carrying out the method according to the invention;

FIGS. 2, 3 and 4 are perspective views respectively of an integrated circuit chip, a coil shown cut in two, and a metal stud like those used according to this first example;

FIGS. 5 and 6 show the tape of FIG. 1 on which are mounted various parts of the modules at two different stages during manufacture;

FIG. 9 is a view similar to FIGS. 5 and 6 illustrating the manufacture of modules according to the second example of carrying out the method according to the on, at a given stage of manufacture;

FIG. 10 is a partial cross-section on an enlarged scale along line X-X of FIG. 9;

FIG. 11 is a view similar to FIG. 9 but corresponding to a more advanced stage of manufacture of the same modules;

DETAILED DESCRIPTION

Figure 6:
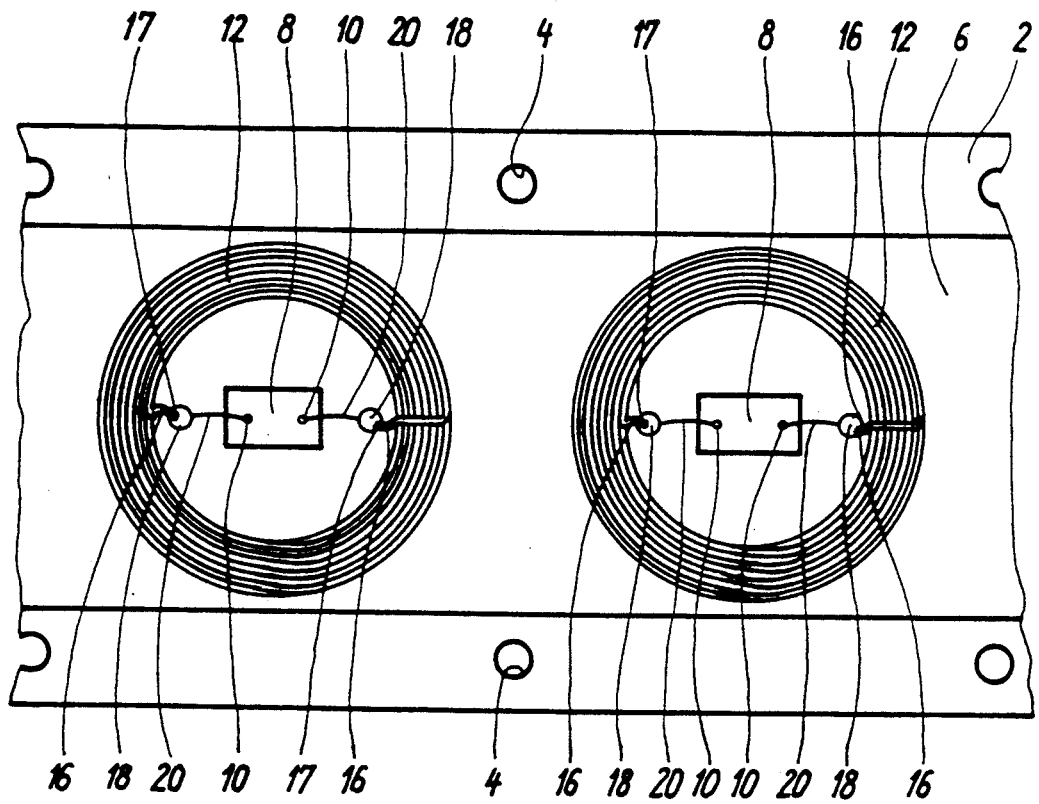

The two manners of carrying out the method of the invention chosen as examples will be described for the case where the method is used to produce electronic modules that include only a single integrated circuit chip but, as will be seen, the same methods would be equally suitable for modules with two or more chips.

Moreover, these manners of carrying out the method are such that modules can be mass produced in the most automated manner possible using well known techniques from the field of electronics, therefore enabling the production cost to be lowered as far as possible.

To produce modules according to the first example of carrying out the method, firstly there is provided, inter alia, a long tape 2, shown partially in FIG. 1, made of an electrically insulating material such as the polyester known under the Trademark "Mylar" or the polyimide sold under the Trademark "Kapton".

This tape 2 serves not only to form substrates for the modules but also to support the various elements thereof, to convey them on a machine and to transfer them from one machine to another during their assembly.

For this reason, the tape 2 (if it is not already suitably perforated) firstly undergoes a stamping operation to produce along each of its edges a series of equidistant perforations 4 that will enable it to be positioned in front of different tools and conveyed past them.

Then, when this stamping operation is finished, the central part of one of the surfaces of tape 2 located between the two rows of perforations 4 is coated with a thin layer 6 of thermosettable insulating adhesive material in the B state, i.e. in a semi-polymerised state in which it is still sufficiently soft and sticky to be able to make objects, which are applied against it with a given force, adhere. This material may for example be an epoxide resin.

Most companies that sell tapes like the tape 2 also sell standard tapes of different thicknesses having the same widths and the same perforations as standard cinematographic films and that are already provided with a layer of adhesive material like the layer 6. Therefore, should any one of these pre-prepared tapes be suitable for the modules to be manufactured and for the machines to be used, the need to perform oneself the described stamping and coating operations could be avoided.

A given number of chips 8 of substantially parallelepipedic shape, like the one shown in FIG. 2, which here include only two connector lugs 10 on their front surface, are also provided to begin with, as are an equal number of coils 12, like that shown partially in FIG. 3, and twice as many small metal studs 19, for example of cylindrical shape and considerably less bulky than the chips, like the one that can be seen in FIG. 4.

As is apparent, the coils 12 used in the present example are flat cylindrical self-supporting coils, each made up of several layers of contiguous coaxial windings 14 made of a very fine metal wire.

To make a coil of this type, a wire—preferably a copper wire—coated with a sheath of insulating thermoadherent material is wound about a cylindrical support and the assembly is heated to partly melt the insulating material, such that when the coil and its support are allowed to cool, all of the contacting parts of the sheath surrounding the windings of wire are bonded together. The coil and support are then separated from one another.

Moreover, when this coil is being manufactured, (a) its diameter is arranged to be equal to that of the modules to be produced, (b) its height is arranged to be equal to the difference between the height of these modules and the sum of the thicknesses of the tape 2 and the layer of adhesive material 6 (see FIG. 1) and (c) the two terminal parts 16 of the coil's wire, which are left free to enable connection of the coil, lead from the same edge of its inner surface and, for example, from approximately diametrically opposite locations, in such a manner that they can later be folded over into the space surrounded by the coil, as shown in FIG. 3.

The metal studs 18 can simply be made by stamping a plate or a tape of their constituent material. This material is preferably nickel or German (or nickel) silver sold under the trademark "ARCAP" which is made of about 56% copper, 25% nickel, 17% zinc and 2% of other metals.

When all of these basic components are available, the first two operations consist in sticking onto the tape 2 firstly pairs of studs 18 and then chips 8 in such a manner as to form identical groups of elements regularly arranged along the tape wherein each stud 18 of a pair is proximate one of the connector lugs 10 of the chip associated therewith, as shown in FIG. 5.

From what was said previously concerning the layer 6 of adhesive material, it is well understood that reference to sticking the studs and chips onto the tape simply means that one of the surfaces of the studs and the rear surface of the chips is applied on this layer.

Furthermore, as shown in FIG. 5, the studs 18 and chips 8 are all situated along the median line of the tape, each chip being placed longitudinally between a pair of studs. This arrangement is suitable for chips which, like those of FIG. 2, have a connection terminal at each end, and for coils 12 whose free parts 16 extend from two diametrically opposed locations at the edge of their internal surface, but this is clearly only one of several possibilities. It would for example also be possible to place the chips and studs in the same manner as above but oriented across the width of the tape, or place the studs alongside the chips or on both sides of the chips. Generally, these studs and chips should be arranged so as facilitate as far as possible assembly of the different parts of the modules on the tape and making the necessary electrical connections. But they must be grouped in the central part of the tape.

Whatever configuration is adopted, once the studs and chips have been stuck on, they are then electrically connected. This is done using the wire connection technique known as "Wire Bonding". In this, two thin wires 20, for example of aluminum, are soldered firstly to one of the chips' connector lugs then to one of the studs of each pair.

When this operation is completed, the coils 12 are stuck by their rear surface onto the tape, i.e. by the surface located opposite that from which the terminal parts 16 extend, in such a manner that the coils 12 each surround a group of chips and studs, as shown in FIG. 6, and so that their terminals i.e. the ends 17 of said terminal parts 16 each make contact with a stud 18 or are close to a stud.

Next, the ends 17 of the terminal parts 16 are soldered to the studs. To do this, these ends need not be stripped because the material of the sheath surrounding the coil's wire melts locally during the soldering operation and this does not prevent a good electric contact being set up between the wire and the studs. However, stripping would be necessary if, alternatively, the ends of the terminal parts were fixed to the studs by a conductive adhesive.

During or after this soldering operation, care must be taken to ensure that the terminal parts are entirely located in the spaces surrounded by the coils. For the wires 20, this problem does not arise because even if the modules are very thin the height of the coil is always at least one and a half or two times greater than the thickness of the chips.

After having reached this stage, shown in FIG. 6, where all of the basic elements 8, 12 and 18 of the modules are assembled on the tape and electrically connected together, the spaces surrounded by the coils are filled with an insulating and thermosettable adhesive material in fluid state, which is preferably opaque to protect the chips against light, at least until the modules are incorporated in the cards or other objects for which they are intended. This material, especially if it is opaque, may be the same as the material making up the layer 6 that was initially applied to the tape 2. Or it may be another material that solidifies at about the same temperature.

After this filling operation, the tape 2 carrying the almost-finished modules is heated to polymerize and completely solidify the filling material and the material of layer 6, thereby completing fixing of the chips 8, the coils 12 and the studs 18 to the tape.

Figure 7:
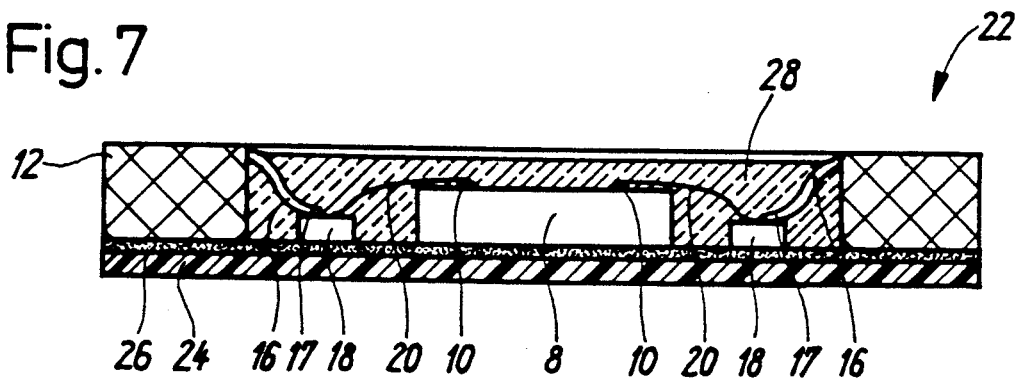
FIG. 7 is a cross-sectional view of one of these modules when finished.

All that then remains to be done is to cut the tape about the periphery of the coils to obtain a series of modules 22, like the one shown in cross-section in FIG. 7, having a substrate 24, a layer 26 of adhesive material, filling material 28, a coil 12 (shown schematically) and all the other parts designated by the same reference numbers as in FIGS. 2 to 6.

The latter operation of separating the modules 22 from the tape 2 can be carried out by the module manufacturer if the objects in which the modules are incorporated are manufactured separately, in which case the modules are delivered in bulk, usually after having been tested, or said operation is carried out by a client or end-producer.

Figure 8:
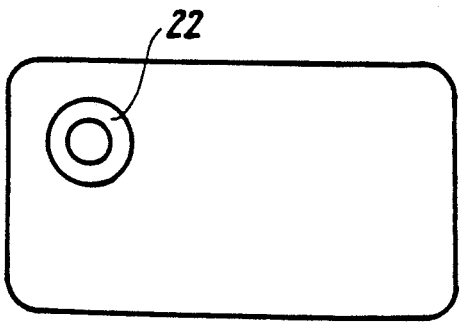
FIG. 8 shows how a module like that of FIG. 7 can be incorporated in a card.

If the modules 22 are to be included in very thin cards, for example standard credit cards, they can be stuck in housings in the card bodies having the same shape and dimensions as the modules, as shown in FIG. 8, exactly in the same manner as contact-type modules.

These housings can be openings if the modules and cards have the same thickness, or can be recesses if the modules are thinner.

In both instances, the coils will provide a very good protection of the chips 8, the wires 20, their junctions with the chips' connector studs and with the studs 18, and the junctions of the terminals 17 of the coils with studs 18, against any constraints which the cards may later undergo.

Moreover, both sides of the card bodies and of the modules should be covered with films of protective plastic material, but even without these the modules are not liable to deterioration by humidity, by a polluted atmosphere or other influences that could interfere with normal operation of contact-type cards.

Also, if the modules 22 are designed for keys, tabs or labels that can be much thicker than the aforementioned cards, they may then be completely embedded in a plastic material.

As previously stated, the first example of the manner of carrying out the present invention is also suitable for modules with several chips. For example, to produce two-chip modules initially there are provided a given number of each of first and second chips and a number of metal studs equal to the number of first or second chips multiplied by the number of the chips' connector lugs for connecting for example the first chips to the coils. The studs and next the chips are then stuck, arranged in a correct manner, onto a tape prepared in the same manner as the tape 2, and the connector lugs of the first chips are connected by "Wire Bonding" to all of the studs, and the connector lugs of the second chips are connected, again by "Wire Bonding", to the studs not intended for the connection of the first chips to the coils. Then, exactly the same operations as those described for single-chip modules are carried out.

To produce modules according to the second example of carrying out the method according to the invention illustrated in FIGS. 9 to 13, to begin with a tape 30 of insulating material, for example Mylar TM or Kapton TM, is processed by the same operations as for the first example to provide perforations 32 along its edges and a layer 34 of insulating adhesive material on the central part of one of its surfaces. In this instance the insulating material may be a thermosettable material in the B state or a thermoplastic material for example of the so-called "Hot melt" type.

It would also be possible to use a standard prepared tape instead.

Moreover, a series of chips 36 is provided, each having two connector lugs 38, as well as a series of coils 40 made in the same manner as the coil 12 of FIG. 3. The coils 40 thus also have terminal parts of free wires 42 but these are not necessarily the same size. For example, if it is desired to produce modules of the same size as the modules 22 with chips of the same thickness, the coils 40 must have the same outer diameter as the coils 12 and they may have the same inner diameter but, for a reason that will be explained later, they can have a lesser height and this difference of height can be compensated by the tape 30 having a greater thickness than the tape 2.

When these elements are all available, firstly the TAB or Tape Automatic Bonding technique is used to both fix the chips onto the tape and produce conductors by means of which their connector lugs can be connected to the ends of the terminal wire parts of the coils.

More specifically, the tape 30 with its layer of adhesive material 32 is submitted to a stamping operation to produce, along its median longitudinal line, equidistant rectangular openings 44 that are slightly longer and wider than the chips, as shown in FIGS. 9 and 10.

Next, a metal foil is stuck firmly on the tape 30 by hot pressing it against the layer of adhesive material 32, and photolithographic techniques are used to remove the major part of this foil leaving only, for each opening 44, two small conductor strips 46 which each have a free end 48 projecting above the opening 44 and preferably have at their other end an enlarged part 50 that forms a connector area for one of the terminals 43 of a coil (see FIGS. 9 and 10).

Moreover, these conductor strips 46 may advantageously be arranged as shown in the drawings, i.e. longitudinally of the tape and on both sides of the openings 44, although this is not a requirement.

As photolithographic processing includes a step of etching the metal foil with a solvent that causes ionic pollution of the insulating tape and conductor strips, it is followed by an appropriate rinsing to remove any trace of such pollution.

Figure 12:
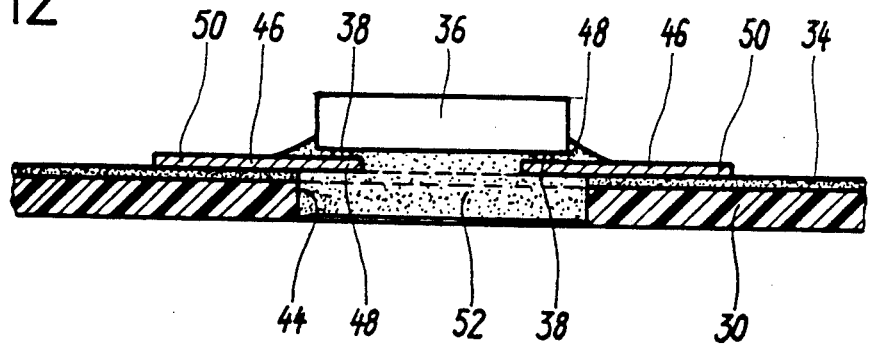
FIG. 12 is a view in partial cross-section on an enlarged scale along line XII-XII of FIG. 11.

After rinsing, the connector lugs 38 of a chip 36 are soldered to the free ends 48 of each pair of conductor strips 46, as shown in FIGS. 11 and 12, i.e. in such a manner that the chip is located on the same side of the tape as these strips, which is contrary to the usual practice when TAB is used.

Lastly, the final operation carried out as part of this technique is to fill the spaces situated between the front surfaces of the chips 36 and the front surface of the tape 30 as well as the openings 44 therein, with a relatively hard, opaque, adhesive, insulating material 52, for example silicone This adhesive material serves not only to protect the chips' integrated circuits against light, but also if these modules are to be incorporated in thin cards to prevent to a large degree any constraints on the modules' substrates from being transmitted to the solder joints between the chips' connector lugs and the free ends of the conductor strips which, as mentioned above, are very fragile points.

When this operation is finished, the stage of progress of the process is the same as when the wires 20 were soldered on the connector lugs of chips 8 and on the metal studs 18 in the previous example of carrying out the process (see FIG. 5).

Figure 13:
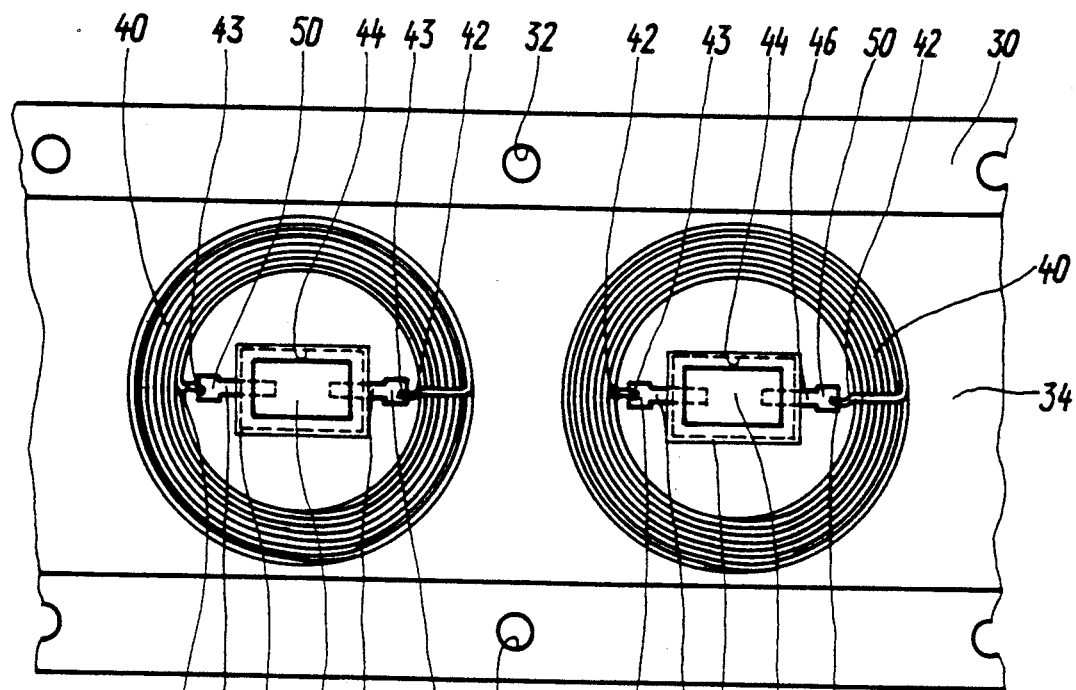
FIG. 13 is a view similar to FIGS. 9 and 11 corresponding to a third stage of manufacture of the same modules.

In other words, the following operations still need to be done: coils 40 must be fixed by their rear surfaces to the tape, around the chips 36 and the conductor strips 46; the terminals 43 must be soldered to the connector areas 50 of these strips, as shown in FIG. 13; the space surrounded by each coil must be filled with an adhesive insulating material (which is not necessarily opaque); and the modules must be electrically tested and separated from the tape by cutting the tape around the coils.

The materials used to fix the coils and fill the spaces surrounded by the coils may in this instance be chosen from thermosettable adhesive materials, thermoplastic adhesive materials and other adhesive materials that polymerize and set when cold, whichever are the most suitable, the filling material not necessarily being the same as the material used to stick the coils. However, if at least one thermoplastic material is chosen and if the layer 34 initially applied to the tape 30 is also a material of the same type, the melting temperature of the second thermoplastic material must be lower than that of the layer 34.

Figure 14:
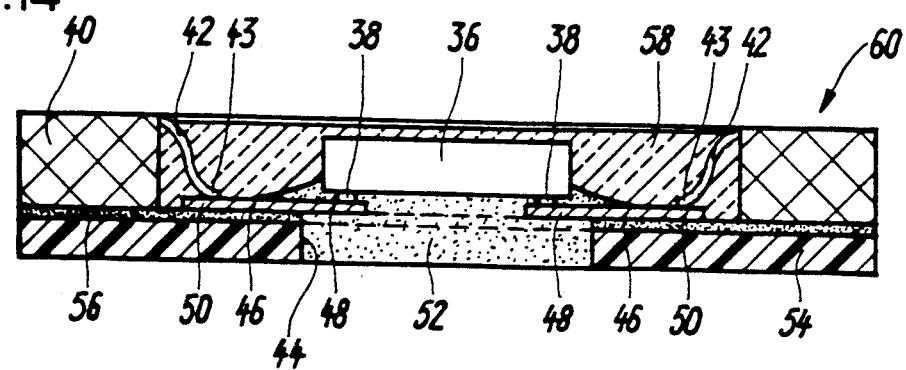
FIG. 14 is a cross-section of one of these modules when finished.

FIG. 14 is a view similar to FIG. 7 showing one of the modules 60 obtained following the just-described second example of carrying out the method. This module's substrate, the remaining parts of the layer 34 of insulating material and the adhesive material filling the space surrounded by the coil are here designated respectively by references 54, 56 and 58.

If it is desired to produce modules of the same type but with two chips, it suffices to:

1. Cut in the tape, for each module, two closely-spaced openings dimensioned to receive the chips;
2. Form on the tape, at the same time as forming conductor strips enabling connection of two lugs of one of the chips to a coil, supplementary conductor strips each having a free end situated above each opening, taking into account the position of the chips' connector lugs having to be connected thereto;
3. Soldering the connector lugs of each chip to the free ends of the associated conductor strips;
4. Filling the empty spaces between the front surfaces of the chips and the tape at the same time as the openings therein with an opaque adhesive insulating material.

The subsequent steps are the same as for the case of single chip modules.

By comparing FIGS. 7 and 14, it can be seen why, for modules 22 and 60 of the same size, the coils 12 may be thicker than coils 40 and the substrates 24 thinner than substrates 54, and why this is greatly preferable. The first reason is that, because of the wires 20, the chips 8 and these wires generally occupy a greater height than the chips 36 and the conductor strips 46. The second reason which is not totally independent of the first, is that in the case of modules 22 the light-sensitive front surfaces of the chips and the mechanically fragile wires 20 and their solder joints with the chips' connector lugs are located nearer the front surfaces of these modules and their coils 12. It is therefore advantageous for the layer 28 of adhesive material above the chips to be thick. Moreover, as the other fragile solder joints of the wires 20 and of the coils' terminals 17 with the metal studs 18 are well protected by this layer, there is no disadvantage in having very thin substrates 24. However, in the modules 60 the front surfaces of chips 36 and the mechanically fragile ends 48 of the conductor strips 46 and the solder joints connecting the chips 36 and the terminals 43 of coils 40 onto these strips, are located nearer the substrates 54. Therefore, it is preferable for the substrates to be quite thick, so as to be more rigid and less liable to be deformed than the substrates 24, and the same should also be true for the layers 52 of adhesive material.

It is clear that the invention is not limited to the types of module shown in FIGS. 7 and 14 with one or several chips, nor to the described manufacturing processes.

For example, by using chips having connector lugs that are coated with a thin layer of gold and coils of very fine copper, like that of FIG. 3, it would be possible to stick these two elements by their back surfaces to the tape and directly solder the coils' terminals to the chips' connector lugs. The electrical connection between the coils and the chips would thus be made up solely of these solder joints.

Also, in some cases it would also be possible to dispense with pre-coating the perforated tape with a layer of adhesive material, and stick the chips, coils and possible interconnection elements such as studs 18 directly onto the tape.

Lastly, in this context, "coil" should not be interpreted in a narrow sense. The term coil is intended to cover not only an inductance-forming conductive element made up of one or more windings. It may include other elements. For example, instead of producing modules according to the invention with self-supporting coils like that of FIG. 3, it would be possible to use coils made of a hollow insulating element of plastic material with a fine insulated wire wound around it, or coils which comprise one or more windings of a conductive wire or strip that are embedded in an annular block of plastic material inside which the terminal parts of this wire or strip would protrude. It should also be noted that the term annular coil does not signify that the coil must necessarily be circular. It could also be square, rectangular or another shape.

I claim:

1. An electronic module for a small portable object, comprising:
   a substrate (24;54) of electrically insulating material:
   a substantially parallelepipedic integrated circuit chip (8;36) having a front surface provided with at least two connector lugs (10;38) and a back surface which is at least indirectly fixed to said substrate:
   a coil (12;40) having two terminals (17;43) and also fixed to said substrate for enabling inductive coupling of the module (22;60) and an apparatus with which the object can cooperate, and respective electrical connections (18;20;46) between said at least two connector lugs and said terminals; and wherein said coil is an annular coil which surrounds a space in which the chip and said electrical connections are fully housed; wherein said coil has a substantially greater height than said chip and said space is filled with a hardened, electrically insulating adhesive material (28;58) so as to protect said chip.

2. An electronic module according to claim 1, wherein said coil (12;40) comprises a conductive element forming at least one winding (14) around said space and having two terminal parts (16;42) situated inside said space, said two terminal parts having ends (17;43) forming said two terminals of the coil.

3. An electronic module according to claim 2, wherein said coil is a self-supporting coil (12;40) comprising several layers of contiguous and substantially coaxial windings (14) formed of a fine metal wire sheathed in electrically insulating material and connected together.

4. An electronic module according to claim 2, wherein the chip (8) is fixed to the substrate (24) by said back surface, and said electrical connections comprise two metal studs (18) that are also fixed to said substrate and to each of which is soldered one of said two terminals (17) of the coil (12), and two fine metal wires (20) each soldered at a first end to one connector lug (10) of the chip and at a second end to one of said metal studs.

5. An electronic module according to claim 4, wherein the chip (8), the coil (12) and the metal studs (18) are fixed to said substrate (24) by means of a layer (26) of thermosettable adhesive material and the adhesive material (28) filling the space surrounded by the coil is an opaque thermosettable material.

6. An electronic module according to claim 2, wherein the chip (38) has said front surface facing said substrate (54) and said electrical connections comprise two conductor strips (46) fixed to said substrate, each conductor strip having two ends (50,48) to which are respectively soldered one of the terminals (43) of the coil (40) and one of the connector lugs (38) of the chip.

7. An electronic module according to claim 6, wherein the coil (40) and the conductor strips (46) are fixed to said substrate (54) by means of a layer (56) of one of a thermosettable or thermoplastic adhesive material.

8. An electronic module according to claim 7, wherein an assembly formed by the substrate (54) and the layer (56) of adhesive material has a rectangular opening (44), and a length and width slightly greater than those of the chip (36), above which are located said chip and the ends (48) of the conductor strips (46) to which the connector lugs are soldered, and wherein said opening and the space situated between the front surface of the chip and said assembly are filled with an opaque, hardened insulating adhesive material (52).

9. An electronic module according to claim 1, wherein the coil (12;40) is cylindrical, the substrate (24;54) is round and the diameter of said substrate is substantially equal to the external diameter of the coil.

* * * * *